United States Patent
Fox et al.

(10) Patent No.: US 7,978,538 B2
(45) Date of Patent: Jul. 12, 2011

(54) SETTING MEMORY DEVICE TERMINATION IN A MEMORY DEVICE AND MEMORY CONTROLLER INTERFACE IN A COMMUNICATION BUS

(75) Inventors: Benjamin A Fox, Rochester, MN (US); William P Hovis, Rochester, MN (US); Thomas W Liang, Rochester, MN (US); Paul Rudrud, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 339 days.

(21) Appl. No.: 12/361,602

(22) Filed: Jan. 29, 2009

(65) Prior Publication Data

US 2010/0188917 A1 Jul. 29, 2010

(51) Int. Cl.
*G11C 5/14* (2006.01)
*G11C 7/00* (2006.01)
*G11C 8/16* (2006.01)
*H03K 17/16* (2006.01)
*H03K 19/094* (2006.01)

(52) U.S. Cl. ......... 365/189.09; 365/189.11; 365/233.13; 326/30; 326/83; 326/86

(58) Field of Classification Search ............... 365/189.09
See application file for complete search history.

(56) References Cited

U.S. PATENT DOCUMENTS

| | | | |
|---|---|---|---|
| 6,049,221 A * | 4/2000 | Ishibashi et al. | 326/30 |
| 6,330,194 B1 | 12/2001 | Thomann et al. | |
| 6,414,525 B2 * | 7/2002 | Urakawa | 327/112 |
| 6,639,423 B2 * | 10/2003 | Martin et al. | 326/30 |
| 6,762,614 B2 | 7/2004 | Rearick et al. | |
| 6,807,650 B2 * | 10/2004 | Lamb et al. | 716/101 |
| 6,958,942 B2 * | 10/2005 | Chang | 365/189.07 |
| 7,362,622 B2 * | 4/2008 | Braun et al. | 365/189.09 |
| 7,411,407 B2 * | 8/2008 | Rearick et al. | 324/713 |
| 7,439,761 B2 * | 10/2008 | Mayer et al. | 326/30 |
| 7,489,160 B2 * | 2/2009 | Kimura | 326/30 |
| 7,514,954 B2 | 4/2009 | Kim et al. | |
| 7,515,487 B2 | 4/2009 | Seo et al. | |
| 7,593,272 B2 | 9/2009 | Doyle et al. | |
| 7,848,175 B2 * | 12/2010 | Fox et al. | 365/230.06 |
| 2008/0272800 A1 * | 11/2008 | Haig et al. | 326/30 |
| 2010/0188908 A1 | 7/2010 | Fox et al. | |
| 2010/0188917 A1 | 7/2010 | Fox et al. | |
| 2010/0188919 A1 | 7/2010 | Fox et al. | |
| 2010/0192000 A1 | 7/2010 | Fox et al. | |

OTHER PUBLICATIONS

JEDEC Standard; POD18—1.8 V Pseudo Open Drain I/O; JESD8-19 Datasheet [online]. JEDEC Solid State Technology Association, 2006 [retrieved on Mar. 12, 2008]. Retrieved from the Internet: <URL: http://www.jedec.org/download/search/JESD8-19.pdfl>.
Notice of Allowance issued for U.S. Appl. No. 12/361,976, mail date Jul. 30, 2010, 7 pp.
Non-Final Office Action for U.S. Appl. No. 12/361,577 mailed Oct. 13, 2010, 10 pp.

\* cited by examiner

*Primary Examiner* — Son L Mai
(74) *Attorney, Agent, or Firm* — Toler Law Group

(57) ABSTRACT

A memory device and memory controller are coupled during driver training to reduce mismatches. The impedances of the system are controlled through a termination at the memory device to yield improvements in timing margins. The coupling of the components on a shared electrical bus through adjustment of the termination values during training removes known offset issues.

20 Claims, 3 Drawing Sheets

SETTING MEMORY DEVICE TERMINATION IN A MEMORY DEVICE AND MEMORY CONTROLLER INTERFACE IN A COMMUNICATION BUS

RELATED APPLICATIONS

The present application relates to co-pending U.S. patent applications, entitled "Setting Controller VREF in a Memory Controller and Memory Device Interface in a Communication Bus", "Setting Controller Termination in a Memory Controller and Memory Device Interface in a Communication Bus", "Calibration of Memory Driver with Offset in a Memory Controller and Memory Device Interface in a Communication Bus", "Setting Memory Controller Driver to Memory Device Termination Value in a Communication Bus", and "Setting Memory Device Vref in a Memory Controller and memory Device Interface in a Communication Bus", by the present inventors, Paul W. Rudrud, Thomas W. Liang, Benjamin A. Fox, and William P. Hovis. The co-pending applications are filed concurrently herewith, and are incorporated by reference in their entireties.

FIELD OF THE INVENTION

This invention relates to a device and method in which a memory device such as a DRAM and a memory controller are coupled during memory driver training to reduce mismatches by adjusting the termination impedance at a termination device of the memory device. The invention further relates to conducting such adjustments to yield improvements in timing margins to remove known offset issues.

BACKGROUND OF THE INVENTION

In an electrical communication bus in which a memory controller is coupled with a memory device such as a GDDR3 DRAM memory, the DRAMs are designed to train their drive impedance and termination values against a reference resistor. However, process variations and resolution may cause variations in the final DRAM training values. The variations may occur within a memory controller coupled to the DRAM if it trains in a similar manner, thereby causing a mismatch in DRAM and controller impedances.

The mismatch may cause timing offsets due to reference voltages not being properly aligned to the resulting data eye. The problem occurs specifically in a GDDR3 interface from a memory controller to a GDDR3 memory device. However, the problem also occurs in a number of other system and sub-system electrical communication buses, resulting in reduced timing margins in other situations.

For the above reasons, what is needed is an arrangement that couples a memory device and its memory controller during memory driver training. This arrangement may reduce mismatches by coupling the components on a shared electrical bus through impedance adjustment of the termination impedance in a memory device during training of the memory device. This may reduce or eliminate known offset issues.

SUMMARY OF THE INVENTION

Embodiments of the present invention provide a method and system in which a memory device and memory controller are coupled during driver training to reduce mismatches. Mismatches are reduced by controlling impedance at the memory device within the system environment to yield improvements in timing margins. The components are coupled on a shared electrical bus and the termination impedance of the memory device is adjusted during training as necessary to remove known offsets.

While embodiments of the invention are specifically described in the context of the GDDR3 interface from a memory controller to a GDDR3 memory device, the device and methods may be applied to a number of system or sub-system electrical communication buses. One aspect of the invention provides that such a method and device may be implemented where termination already exists.

Another aspect of the invention provides a method of setting a memory device's termination impedance in an electrical communication bus having a memory controller connected to the memory device. A memory device is connected in the electrical communication bus with a corresponding memory controller during training of the driver impedance and receive termination of a memory device. A voltage is initialized on the communication bus as a bit level "0" voltage to be read by the memory device. The voltage is set on a test path of the memory controller corresponding to the voltage on the electrical communication bus. The voltage on the test path is adjusted and monitored, and when the voltage on the test path just switches its value, a current based thereon is applied to the memory device to have the impedance of the termination device set based on the switched voltage.

Embodiments may include adjusting the voltage until it switches to a level of 0.4 VDD on the test path, and setting the termination impedance at the termination device based on the voltage level of 0.4 VDD.

According to another aspect of the invention, there is provided a coupled memory controller and memory device in an electrical communication bus. A connection is provided between the memory interface of the memory controller to the memory device as a data net. The memory controller is programmed to initialize a voltage level as a 0 bit level voltage on the connection to the memory device. A test path is connected to the connection between the memory controller and memory device to have the test voltage level applied thereto. The test path is programmed for adjusting the voltage level and is connected to a reference resistor pair 61 of the memory device 15. A detector serves to detect a predetermined switched voltage on the test path, and a current setting module serves to apply a current to the memory device to set the impedance of the termination device thereof based on the switched predetermined voltage.

These and other advantages and features that characterize the invention are set forth in the claims annexed hereto and forming a further part hereof. However, for a better understanding of the invention, and of the advantages and objectives attained through its use, reference should be made to the Drawings, and to the accompanying descriptive matter, in which there are described exemplary embodiments of the invention.

DETAILED DESCRIPTION OF THE INVENTION

Embodiments consistent with the invention may capitalize on the ability to couple a memory device such as a DRAM and a memory controller during driver training to reduce mismatches by adjusting the impedance at a termination device of the memory device to yield improvements in timing margins. In more general terms, coupling the components on a shared electrical bus through level adjustment dramatically removes known offset issues. While embodiments of the invention are described specifically for a GDDR3 interface from a memory controller to a memory device, such as a GDDR3 DRAM, the system and method may be applied to any number of system and sub-system electrical communication buses.

Figure 1:
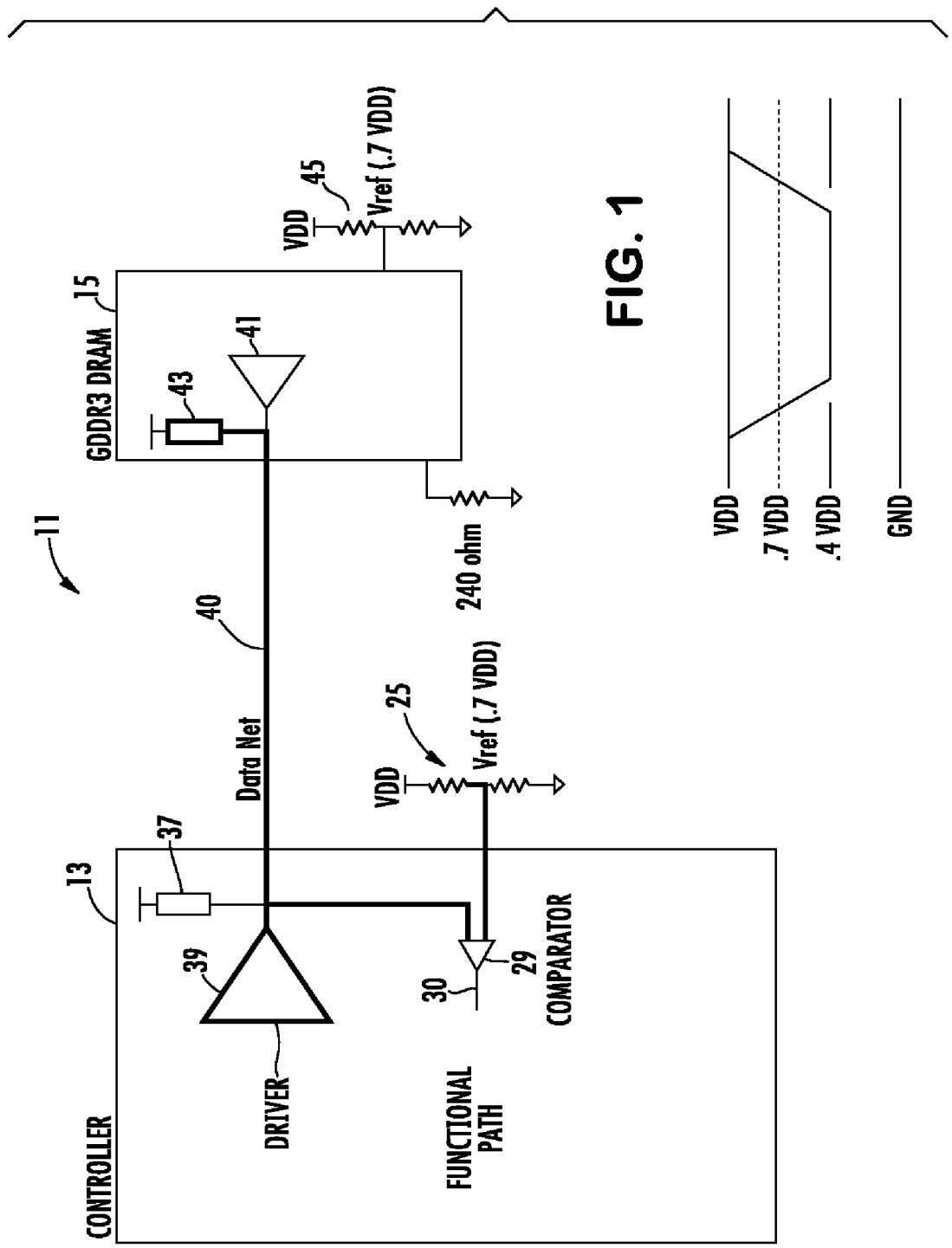
FIG. 1 is schematic diagram illustrating a typical prior art interface in an electrical communication bus between a memory controller and a memory device, such as a GDDR3 DRAM.

Turning more particularly to the drawings, FIG. 1 shows a typical memory device interface system 11. More particularly, a memory controller 13 may be connected through a data net 40 to a memory device 15, such as a GDDR3 DRAM. A data net 40, i.e., a bus connection, connects to a functional path 30 including a comparator 29 in a memory controller 13. The functional path 30 may also be connected to the data net 40, a memory controller driver 39, and a termination device 37 in the memory controller 13, such as a large resistor. A reference voltage for the memory controller 13 may be typically provided through a voltage divider pair of resistors 25. The memory device 15 also includes a driver 41 and a termination device 43. A reference voltage for the memory device may be provided through a pair of resistors 45.

In an arrangement such as is shown in FIG. 1, it may be helpful to deal with variations in impedances between the devices in order to improve timing margins between the memory controller 13 and memory device 15 as operated on the net 40. More particularly, impedances at the termination device 43 of the memory device 15 may be modified so that the vertical center of the read eye to the memory device may be used to obtain maximum timing margins.

Figure 2:
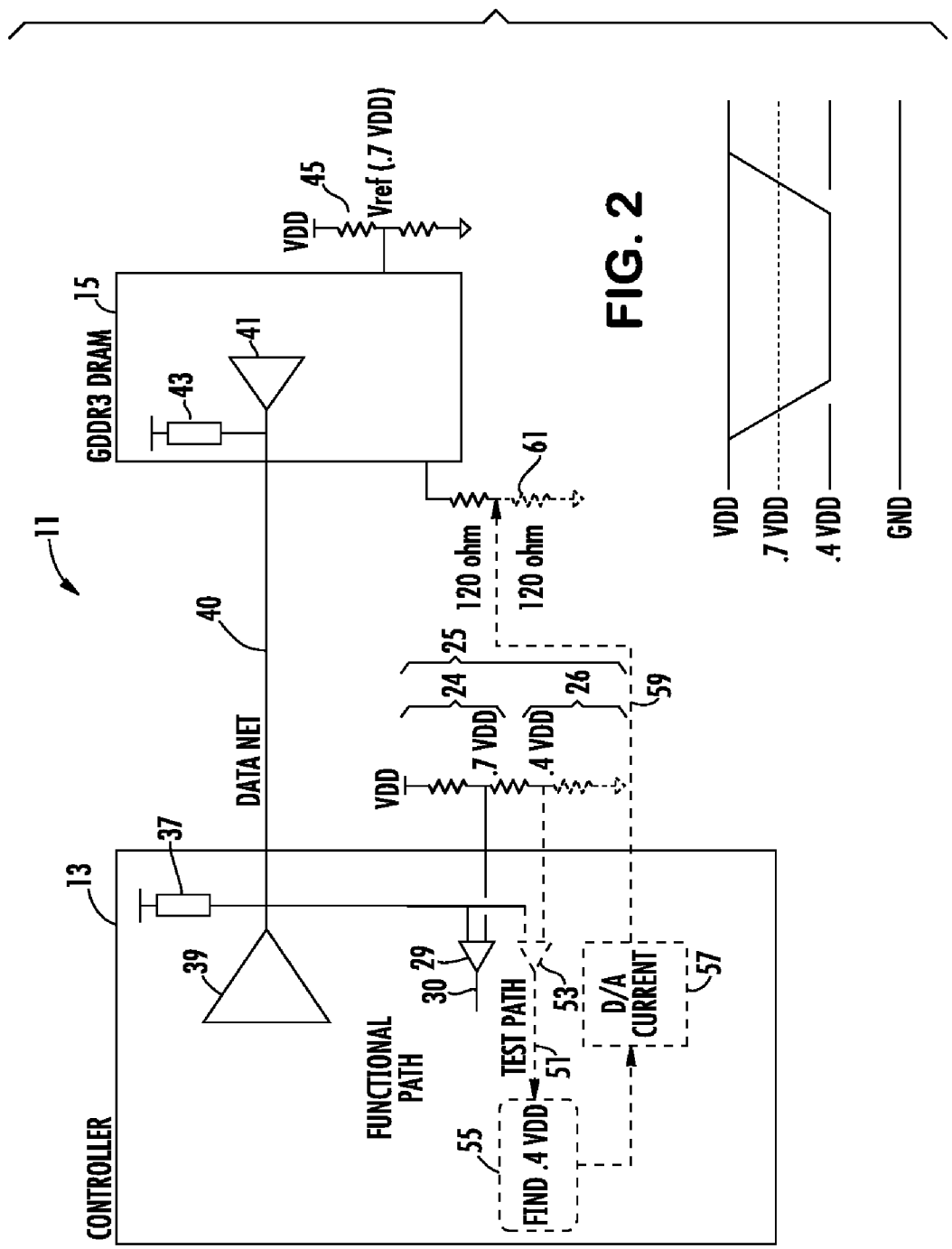
FIG. 2 is a schematic diagram of one embodiment of the invention for coupling a memory device and memory controller during memory device driver training to reduce mismatches.

An embodiment of the invention is depicted generally by modified system 11, as illustrated in FIG. 2. A memory device 15, such as a GDDR3 DRAM, includes driver 41 and termination device 43, which may typically be a gated resistor, and a reference voltage supplied through pair of resistors 45. Memory controller 13 may initialize a 0 bit level value, i.e., the memory controller 13 driver 39 may be initialized by setting a 0 bit level voltage. The impedances of both the controller driver 39 and memory device 15 termination 43 determines what the voltage of the 0 bit level will be on a data net 40. Embodiments address variations in impedances in order to obtain the greatest timing margin on the data interface through the data net 40.

In the exemplary embodiment, an initial voltage may be set on the data net 40 by the memory controller 13 and may be initialized as a 0 bit level voltage. The memory device 15 reads the 0 bit level voltage on the data net 40, which may be applied to a termination device 43. The voltage may also be applied to functional path 30 of the memory controller 13 having a comparator 29. The functional path 30 also has applied thereto a voltage through a pair of resistors 24 of resistor ladder 25 in a conventional manner similar to that described in connection with FIG. 1. In addition, a second voltage may be applied through a pair of resistors 26 of resistor ladder 25 to a test path 51 having a comparator 53 and including a voltage detector 55, and a current setting module 57. The current setting module 57 applies a current through a connection 59 and through resistor pair 61 to memory device 15 to set the impedance at the termination device 43.

In the embodiment of FIG. 2, the voltage on test path 51 may be detected by detector 55. For example, the initialized 0 bit level voltage from the data net 40 may be detected. The voltage on the test path 51 may be adjusted to a predetermined level, e.g., to a 0.4 VDD level voltage. This voltage may be detected by detector 55. The impedance of impedance device 43 may be set based on the 0.4 VDD, and that voltage may be set at the 0 bit level voltage on the data net 40.

In accordance with the embodiment of FIG. 2, when the memory device 15 receives a 0 bit voltage the impedances of both the memory controller 13 driver 39 and memory device 15 termination 43 determine what the voltage 0 bit level will be on the data net 40. To obtain the optimal timing margin on the data interface 40, it is important to deal with any variations and impedances. Thus, by modifying the termination of memory device 15, the vertical center of the read eye to the memory device may be used to obtain the maximum timing margin. Accordingly, the invention does not require modification to the memory device 15.

By changing the termination 43 value at the memory device 15, the 0 bit level value seen at the memory device 15 may be changed. The voltage may be determined by three resistors of ladder 25, making up pairs 24 and 25, which divide to obtain a 0.7 VDD and a 0.4 VDD on the memory controller 13 side. This is compared to FIG. 1 in which 0.7 VDD was the only input. In a specific implementation of the invention, 0.4 VDD is a new input which is the value that is preferred for the 0 bit level. The test path 51 voltage may be changed until a change in the test path voltage occurs that corresponds to a 0.4 VDD 0 bit level voltage as optimal for the 0.7 VDD reference voltage.

Figure 3:
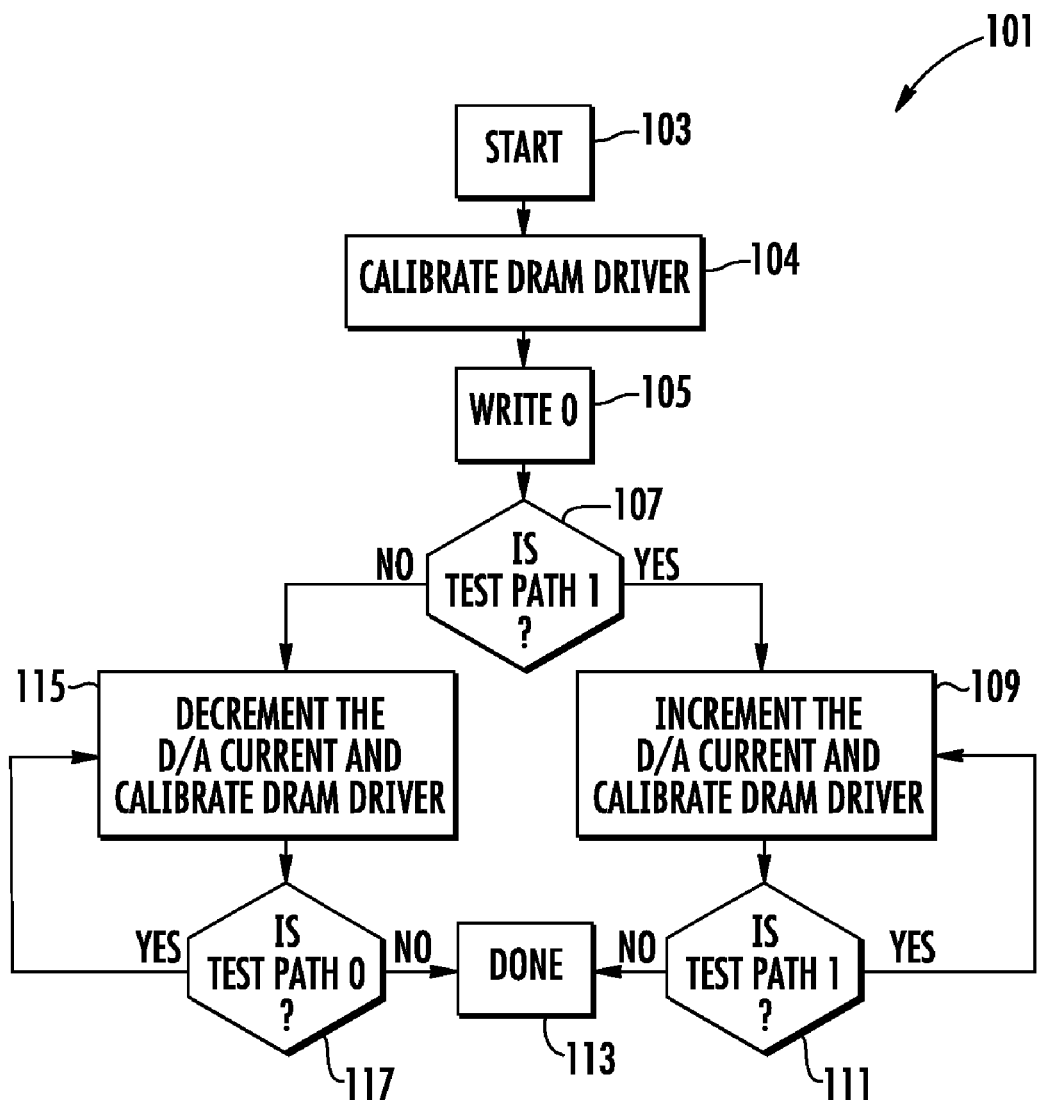
FIG. 3 is a flow diagram illustrating an operation during the matching of the memory controller and the memory device of FIG. 2.

FIG. 3 illustrates in a flow diagram 101 implementation of the method of the invention of the embodiment of FIG. 2. The exemplary method starts at step 103. The memory device driver is calibrated at step 104. The memory controller 13 is initiated at step 105 to drive a 0 bit level voltage on the data net 40. Detector 55 determines at step 107 if the test path 51 is at bit level "1". If so, the current is incremented at step 109 and the test path is again tested at step 111 until it changes, so that it is no longer at a 1 bit level. The process ends at step 113 unless the test path 51 was not at a 1 bit level. If the test path was not at a 1 bit level, the current is decremented at step 115 and the test path is again tested at step 117. The process continues until the test path changes, and the process concludes at step 115.

As may be appreciated, in the invention, other application variables may play a role in the optimal training of the interface relative to the appropriate high, low and Vref values or termination strengths that determine the levels. More specifically, impedance or termination values may vary with temperature and/or voltage level variations associated with activity on other system or sub-systems resources. Calibration from any of these methods may either be repeated as conditions change for maintenance of optimal settings and performance, or unique settings may be saved for different conditions if desired.

In an exemplary implementation, a temperature change of greater than 20 degrees centigrade, or some other value, from the original or last calibration could initiate a new calibration or loading of an alternate set of previously stored calibration values associated with the new temperature. This also could be implemented with variations associated with the activation or deactivation of other system resources such as turning on and off of another bus, interface, controller, or processor that in some way impacts the performance of the interface described herein. Recalibration in such an instance could be initiated. Alternate settings could be used with the performance of the interface under such conditions. Further, circuits that monitor the voltage being used on an interface could also invoke an adjustment using previously stored values or initiate new training events to obtain maximum margins.

While the invention has been described with reference to a GDDR3 device and memory controller sub-system, one of ordinary skill in the art could also easily apply these techniques to other interfaces without departing from the concept disclosed and implemented in accordance with the embodiments described herein.

While the present invention has been illustrated by a description of various embodiments and while these embodiments have been described in considerable detail, it is not the intention of the Applicants' to restrict or in anyway limit to scope of appended claims to such detail. The invention in its broader aspects is therefore not limited to the specific details, representative apparatus and method, an illustrative example shown and described. Accordingly, departures may be made from such details without departing from the spirit or scope of Applicants' general inventive concept.

What is claimed is:

1. A method of setting a memory device's termination impedance in an electrical communication bus having a memory controller connected to a memory device, comprising:
   connecting a memory device having a termination device with a corresponding memory controller during training of a drive impedance of a driver of the memory device;
   initiating a voltage on the communication bus as a bit level 0 to be read by the memory device;
   setting a voltage on a test path of the memory controller at the voltage on the electrical communication bus;
   adjusting and monitoring the voltage on the test path; and
   when the voltage on the test path switches its value, setting the impedance at the termination device based on said switched voltage.

2. The method of claim 1, wherein the switched voltage on the test path is set as a 0 bit level voltage on the bus.

3. The method of claim 1, wherein said memory device is a GDDR3 memory device.

4. The method of claim 1, wherein a reference voltage for a functional path of the memory controller is set at 0.7 VDD and the 0 bit level voltage on the test path of the memory controller is set at 0.4 VDD, as the switched voltage.

5. The method of claim 1 further comprising:
   setting a reference voltage value at a reference resistor arrangement connected to the memory controller at a functional path thereof;
   setting an initialized voltage from the electrical communication bus at the test path of the memory controller;
   adjusting the voltage at the test path until it changes;
   setting the impedance of the termination device based on said changed voltage; and
   setting the 0 bit level voltage on the electrical communication bus to correspond to the changed voltage.

6. The method of claim 1, wherein said test path is monitored to detect when said voltage switches said value to a level of 0.4 VDD, and further comprising setting the termination impedance at the termination device based on said voltage level of 0.4 VDD.

7. The method of claim 1, wherein the impedance of the termination device is changed by applying a predetermined current to the memory device based on said changed voltage on said test path.

8. The method of claim 7, wherein said switched voltage is a predetermined value.

9. The method of claim 7, wherein said current is set based on voltage level of 0.4 VDD.

10. The method of claim 7, wherein said memory device is a GDDR3 DRAM.

11. A coupled memory controller and memory device in an electrical communication bus, comprising:
    a connection between a memory interface of the memory controller to the memory device, wherein the memory controller is programmed to set a voltage level initialized as a 0 bit level voltage to the memory device, and said memory device having a termination device;
    a test path on the memory controller connected to the connection between the memory controller and the memory device to have the initialized voltage level applied thereto, said test path programmed for adjusting said initialized voltage level, and said test path connected to the memory device;
    a detector for detecting a predetermined switched voltage on the test path; and
    a current module for setting the impedance of the termination device by applying a current to the memory device based on said predetermined switched voltage.

12. The device of claim 11, wherein said detector is programmed for detecting said predetermined switched voltage as 0.4 VDD.

13. The device of claim 11, further comprising said controller being programmed for setting the initialized bit level voltage on the connection between memory controller and the memory device at said switched predetermined level.

14. The device of claim 13, wherein said switched voltage predetermined level is 0.4 VDD.

15. The device of claim 11, wherein said memory device is a GDDR3 DRAM, and said connection between said memory controller and memory device is an electrical communication bus.

16. The device of claim 11, further comprising a current setting device in said memory controller for applying a current to said memory device based on said predetermined switched voltage.

17. The device of claim 16, further comprising a connection from said memory controller to said memory device for applying a current from said current setting device thereto.

18. The device of claim 17, wherein said memory device is a GDDR3 DRAM.

19. The device of claim 18, wherein said initialized voltage is set as a 0 bit level voltage.

20. A coupled memory controller and memory device in an electrical communication bus, comprising:
    a connection between a memory interface of the memory controller to the memory device, wherein the memory controller is programmed to set a voltage level initialized as a 0 bit level voltage to the memory device, and said memory device having a termination device;
    a test path on the memory controller connected to the connection between the memory controller and the memory device to have the initialized voltage level applied thereto, said test path programmed for adjusting said initialized voltage level, and said test path connected to the memory device;
    a detector for detecting a predetermined switched voltage on the test path;
    a current module for setting the impedance of the termination device by applying a current to the memory device based on said predetermined switched voltage; and
    a current setting device in said memory controller for applying a current to said memory device based on said predetermined switched voltage, and the memory device being a GDDR3 DRAM.

* * * * *